United States Patent
Linsky et al.

(10) Patent No.: US 7,027,796 B1
(45) Date of Patent: Apr. 11, 2006

(54) METHOD AND APPARATUS FOR AUTOMATIC FAST LOCKING POWER CONSERVING SYNTHESIZER

(75) Inventors: Joel B. Linsky, San Diego, CA (US); Lars G. Jansson, Bethel, ME (US); Mark V. Lane, San Diego, CA (US)

(73) Assignee: RFMD WPAN, Inc., San Diego, CA (US)

( * ) Notice: Subject to any disclaimer, the term of this patent is extended or adjusted under 35 U.S.C. 154(b) by 886 days.

(21) Appl. No.: 09/888,108

(22) Filed: Jun. 22, 2001

(51) Int. Cl.
*H04B 1/16* (2006.01)

(52) U.S. Cl. .............................. 455/343.1; 455/343.2; 455/343.5

(58) Field of Classification Search ................ 455/76, 455/183.1, 343.2, 343.5, 260, 165.1, 262, 455/264, 343.1
See application file for complete search history.

(56) References Cited

U.S. PATENT DOCUMENTS

| | | | | |
|---|---|---|---|---|
| 4,198,605 A * | 4/1980 | Yamashita et al. | ........ | 455/161.1 |
| 4,521,918 A * | 6/1985 | Challen | ............... | 455/343.1 |
| 4,631,496 A * | 12/1986 | Borras et al. | ................ | 331/1 A |
| 4,893,094 A * | 1/1990 | Herold et al. | ................ | 331/1 A |
| 4,968,950 A * | 11/1990 | Babin et al. | ................ | 331/1 A |
| 5,075,638 A * | 12/1991 | Babin et al. | ................ | 331/1 A |
| 5,103,192 A * | 4/1992 | Sekine et al. | ................ | 331/1 A |
| 5,278,521 A * | 1/1994 | Sato | ............... | 331/14 |
| 5,384,551 A * | 1/1995 | Kennedy et al. | ............... | 331/17 |
| 5,408,201 A * | 4/1995 | Uriya | .............. | 331/2 |
| 5,475,877 A * | 12/1995 | Adachi | ................ | 455/343.2 |
| 5,572,168 A * | 11/1996 | Kasturia | ........................ | 331/2 |
| 5,625,326 A * | 4/1997 | Raikaa | ....................... | 331/64 |
| 5,794,137 A * | 8/1998 | Harte | ...................... | 455/343.4 |
| 5,963,852 A * | 10/1999 | Schlang et al. | ................ | 455/76 |
| 6,658,240 B1 * | 12/2003 | Ries | ....................... | 455/183.1 |
| 6,710,664 B1 | 3/2004 | Humphreys et al. | ........... | 331/11 |
| 6,795,516 B1 * | 9/2004 | Takekawa et al. | ........... | 375/376 |
| 6,838,951 B1 | 1/2005 | Nieri et al. | ............. | 331/177 V |

OTHER PUBLICATIONS

Paul Horowitz, Winfield Hill, The Art of Electronics, Second Edition, Digital Meets Analog, Chapter 9, pps. 644-645, Cambridge University Press.

* cited by examiner

*Primary Examiner*—Bing Q. Bui
(74) *Attorney, Agent, or Firm*—Withrow & Terranova, PLLC

(57) ABSTRACT

A frequency synthesizer device with a fast off-to-lock time to enable intermittent operation and achieve power savings through automatic control of its On/Off sequence.

A relatively fast off-to-lock time is achieved by controlling the sequence of how various components of the synthesizer are reactivated. The voltage controlled oscillator is reactivated, at first operating at its previous operating frequency prior to being deactivated. The phase frequency detector is inhibited while its input signals, a reference signal and a feedback signal, are activated. In a channel hopping communication scheme, the phase frequency detector coarsely tunes the synthesizer to its previous operating frequency, and then jumps to its new operating frequency. Another aspect of the invention provides improved channel locking by guaranteeing that the phase of the feedback signal in a phase lock loop initially lags the phase of the reference frequency signal at the phase frequency detector.

47 Claims, 8 Drawing Sheets

METHOD AND APPARATUS FOR AUTOMATIC FAST LOCKING POWER CONSERVING SYNTHESIZER

FIELD

The invention pertains to a frequency synthesizer device and in particular to a frequency synthesizer device with a fast off-to-lock time to enable cycled or intermittent operation and achieve power savings.

BACKGROUND

Power consumption is an important factor in the design of many electronic devices. Often, these devices must operate on a limited power supply. For example, devices such as mobile and wireless phones, mobile computers, and other devices are generally battery operated. To maximize the operating time in between changing or recharging batteries, mobile devices are often designed with low power consumption components and power saving features. In other applications, it is desirable to minimize the power consumption of devices, mobile and non-mobile, to reduce operating costs and/or extend the life of the devices and/or their components.

Many mobile devices include wireless communication devices and interfaces to send and receive data. These wireless communication devices and interfaces are often a significant source of power consumption. Various forms of wireless or over-the-air communication systems, including radio transmissions, have been employed.

Some of these mobile device have more than one mode of operation, including modes specifically designed to conserve power. Power saving modes vary in the extent that a device's components are cycled or powered off. These power saving modes are typically referred to by various names including standby mode, sleep mode, and idle mode. For purposes of this application, these terms may be used interchangeably to refer to a power savings mode where one or more components of the device are reconfigured to consume less power than during normal operation or no power at all.

Generally, radio communication systems include a radio (modem) device to transmit and receive signals, and a control unit to control the operation of the radio device.

Synthesizers are commonly employed within radio devices to lock on an operating, carrier, or transmission frequency. The terms operating frequency, carrier frequency, or transmission frequency are herein used interchangeably to mean the frequency or channel on which communications are received or transmitted.

Conventional synthesizers typically have relatively long tuning times when powered On. The synthesizer tuning time includes the time it takes the synthesizer to reach stable operation at a particular frequency. Some conventional synthesizers are implemented using a phase-lock-loop (PLL) design. One tuning delay, known as the channel-to-channel lock time, for a PLL-based synthesizer includes the time it takes to lock onto a desired frequency and phase. If a synthesizer is not able to power on and lock onto the desired operating frequency within a maximum time period, then a device may miss receiving or transmitting data.

One cause of tuning delays when a conventional PLL-based synthesizer is first powered On or changes operating frequencies is that the tuning time is not determinable or predictable because the initial phase is unknown and/or random. That is, the synthesizer may take a relatively short time, or a relatively long time beyond a maximum channel-to-channel time, to lock onto the desired frequency and phase.

One way to avoid missed transmissions is to keep the synthesizer powered on at all times, thereby avoiding power on delays. However, this is contrary to power efficiency since the synthesizer would drain needed power even when no transmissions are expected. Another scheme to avoid missed transmissions is to power On the synthesizer early enough to permit it to be operational by the time a transmission is expected. This typically requires that an external system, such as a control unit, manage and monitor the operation of the synthesizer. This adds complexity to the design of a communication system.

Therefore, there is a need for a synthesizer system with relatively short and predictable tuning times to achieve savings in average power consumption and that is simple to integrate into existing control units.

DETAILED DESCRIPTION

In the following detailed description of the invention, numerous specific details are set forth in order to provide a thorough understanding of the invention. However, one skilled in the art would recognize that the invention may be practiced without these specific details. In other instances well known methods, procedures, components, and circuits have not been described in detail so as not to unnecessarily obscure aspects of the invention.

One aspect of the invention provides a frequency synthesizer that achieves a relatively fast off-to-lock time by controlling the sequence of how various components of the synthesizer are reactivated. The off-to-lock time is defined as the time it takes a synthesizer to become operational and lock to a channel, carrier, or operating frequency once it is activated, reactivated, or powered On, and may include settling time and/or tuning time. The relatively fast off-to-lock time permits the synthesizer to conserve power by internally cycling power to one or more of its components. The frequency synthesizer is capable of automatically controlling its internal power cycling by triggering from an externally generated signal to activate or deactivate one or more components of the synthesizer device. As used herein, the terms deactivate, power off, and disable may be used interchangeably unless otherwise specified or understood by context; the terms activate, reactivate, power On, enable, and re-enable may also be used interchangeably unless otherwise specified or understood by context.

Figure 1:
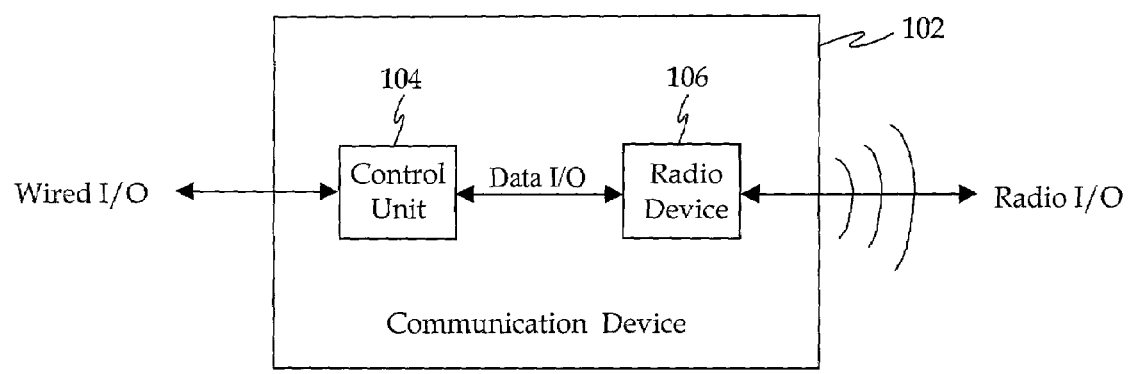
FIG. 1 is a block diagram of a communication device utilizing the automatic fast locking power conserving synthesizer illustrating one embodiment of the invention.

FIG. 1 is a block diagram of a communication device utilizing the automatic fast locking power conserving synthesizer illustrating one embodiment of the invention. The communication device 102 may be either a master or slave device to transmit and/or receive data over one or more channels. The communication device 102 may be employed as part of various electronic devices including mobile computers, wireless phones, wireless headsets, hand held electronic devices, and other devices that are part of a communication system.

In one embodiment, the communication device 102 includes a control unit 104 and a radio (modem) device 106. The control unit 104 may include a baseband controller to manage the operation of the radio (modem) device 106. The radio (modem) device 106 generally performs as a transceiver, or a transmitter and/or receiver, to transmit and receive communications.

Figure 2:
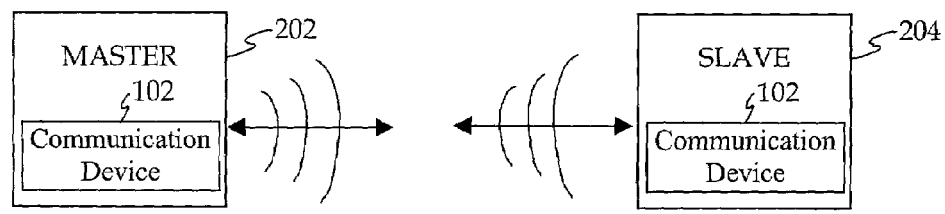
FIG. 2A is a block diagram of a master and slave communication scheme utilizing the automatic fast locking power conserving synthesizer illustrating one embodiment of the invention.
FIG. 2B is a waveform diagram of transmit and receive time slots for the master and slave communication scheme illustrated in FIG. 2A.

As illustrated in FIG. 2A, a wireless communication scheme may include a master device 202 and a slave device 204. Both the master device 202 and the slave device 204 include a communication device 102 which includes a radio device 106 to receive and transmit. The master device 202 initiates transmissions and controls when and/or if a slave device 204 may transmit. A slave device 204 typically awaits for transmissions from the master device 202.

In some wireless communication systems, communication devices, master or slave devices, may not transmit and receive simultaneously. Ordinarily, the master device 202 establishes time slots, illustrated in FIG. 2B, in which it may transmit (TXm) and other time slots in which it receives (RXm) communications. Similarly, based on the time slots established by the master device 202, the slave device 204 may transmit (TXs) when the master device 202 is receiving (RXm) and receive (RXs) when the master device 202 is transmitting (TXm). Usually, a slave device 204 may not initiate transmissions unless enabled by the master device 202. There may be idle time in between time slots where no transmissions take place.

Figure 2B:
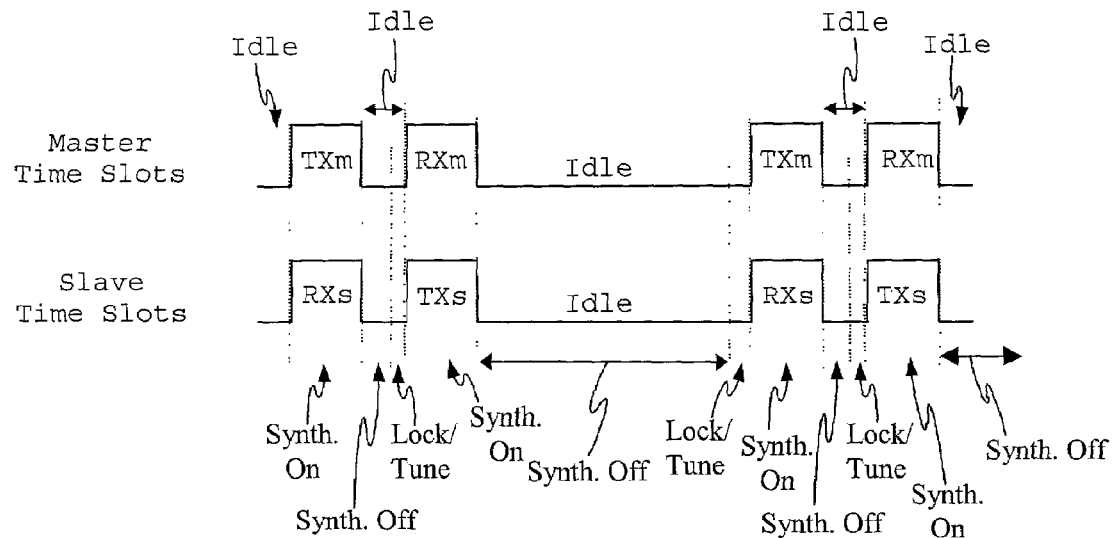

Typically, slave devices 204 keep their receivers powered On to detect and receive transmissions from a master device 202. Keeping a slave device's receiver powered On wastes precious power if the master device 202 only transmits during known periodic time slots as illustrated in FIG. 2B.

One power saving scheme relies on a duty cycle, turning Off a device's receiver during those time slots when transmissions are not expected. Typically, cycling a radio device to conserve power includes turning the radio device's synthesizer Off and On intermittently, thereby reducing the average power consumption of the synthesizer. However, in order to receive and/or transmit communications, a receiver or transmitter that has been powered Off needs to power On and lock to a carrier frequency.

Many communication standards specify the maximum duration of a time slot for master 202 and/or slave devices 204. This limits a device synthesizer's off-to-lock time, the amount of time that a powered Off radio device 106 and/or synthesizer has to power on and lock onto a transmission, carrier, or operating frequency. However, conventional synthesizers typically have relatively long off-to-lock times compared with their channel-to-channel lock times. Thus, it may not be possible to cycle a conventional synthesizer, power it Off then power it on and lock it to a carrier frequency, within a maximum defined time period in a predictable and deterministic manner.

Some communication standards or systems, including General Packet Rate System (GPRS) and Bluetooth Specification v.1.1, implement a channel hopping scheme where transmission frequencies change every time slot sequence. Typically, a Channel Jump signal is generated and a new transmission frequency is indicated to the radio device 106. Thus, a communication device 102 that turns its radio receiver Off intermittently or cycles to conserve power must be able to reactivate its receiver, turning it back on and locking to a new carrier frequency, quickly enough to receive transmissions. This is difficult to do with a maximum off-to-lock time of as short as two hundred micro-seconds (200 μsec.).

Figure 3:
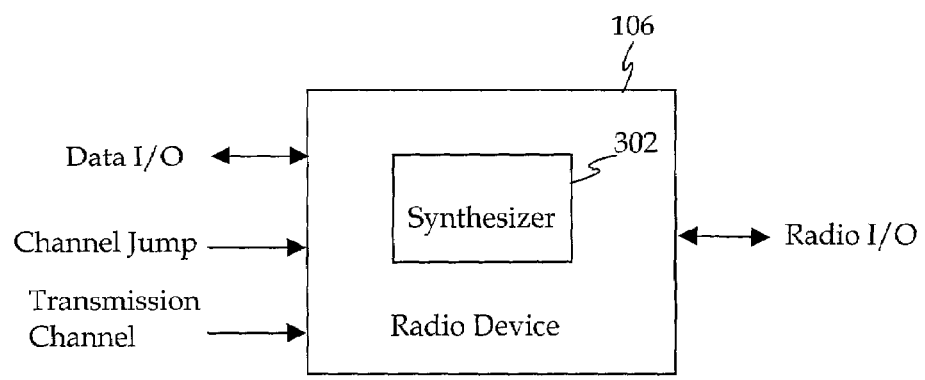
FIG. 3 is a block diagram of a radio device utilizing the automatic fast locking power conserving synthesizer illustrating another embodiment of the invention.

FIG. 3 illustrates one embodiment of the radio (modem) device 106. Typically, the radio device 106 receives and transmits data wirelessly over a radio interface (Radio I/O). The radio device 106 includes an automatic fast locking power conserving synthesizer 302 to tune to an operating or carrier frequency or channel for transmitting and/or receiving communications. The radio device 106 may also receive one or more control signals to configure the radio device 106. The embodiment of the radio device 106 illustrated in FIG. 3, may receive a Channel Jump signal which indicates a hop or change in the carrier frequency or channel, and a New Transmission Channel signal which indicates the operating or carrier frequency. The synthesizer 302 is capable of changing carrier frequencies, or frequency hop, during operation.

Figure 4:
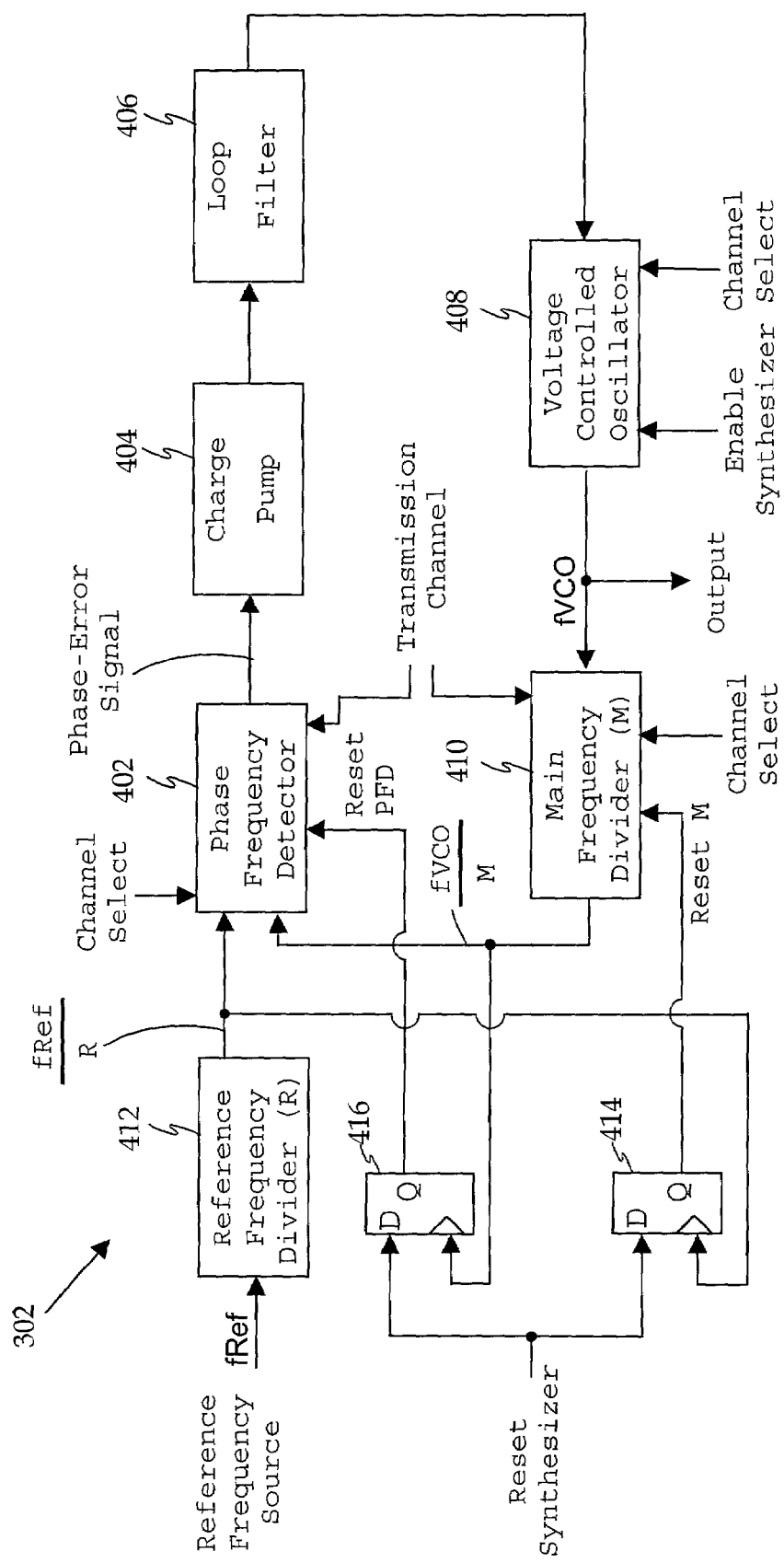
FIG. 4 is a block diagram of one embodiment of the automatic fast locking power conserving synthesizer.

FIG. 4 is a block diagram of a radio device utilizing the automatic fast locking power conserving synthesizer 302 illustrating another embodiment of the invention. The synthesizer 302 is configured as a phase locked loop (PLL) and includes a phase frequency detector 402, a charge pump 404, a loop filter 406, a voltage controlled oscillator (VCO) 408, a main frequency divider (M) 410, and a reference frequency divider (R) 412. The main frequency divider 410 and reference frequency divider 412 may be implemented as counters and/or modulus scalers, to scale an input frequency by a chosen value, and may be digitally configured.

Ordinarily, a reference frequency (fRef) is provided to the synthesizer 302 to lock on a desired carrier frequency. The output frequency of the synthesizer 302 is taken as the output frequency of the voltage controlled oscillator (fVCO) 408 and is given as $fVCO = (M/R) \times fRef$, where M is the dividing value of the main frequency divider 410 and R is the dividing value of the reference frequency divider 412. In one embodiment of the synthesizer, the voltage controlled oscillator output frequency fVCO may be approximately 2.5 GHz. In various implementations, the main frequency divider M 410 and/or reference frequency divider R 412 may be programmable or configurable to a desired dividing value.

The phase frequency detector 402 compares two input signal frequencies and generates an output signal that is a measure of their phase difference. Generally, if the phase of a reference frequency (fRef) does not equal the phase of the output frequency from the voltage controlled oscillator 408 (fVCO) the phase frequency detector 402 together with the charge pump 404 and loop filter 406 generate a direct-current (DC) or low-frequency phase-error signal that causes the VCO output frequency (fVCO) to deviate in the direction of fRef.

The voltage controlled oscillator (VCO) 408 is an oscillator whose frequency is proportional to an applied input voltage representing the phase-error signal. Thus, the voltage controlled oscillator 408 reacts to the phase-error signal and causes the phase of its output frequency fVCO to move towards the phase of the reference frequency fRef. In this manner, the voltage controlled oscillator 408 eventually locks onto fRef, thereby maintaining a fixed phase relationship between fVCO and the reference frequency fRef. In one implementation, once the voltage controlled oscillator 408 locks onto fRef, the error-signal from the phase frequency detector 402, charge pump 404, and loop filter 406 to the voltage controlled oscillator 408 is a relatively constant DC signal.

The source of the reference frequency fRef may be any device capable of generating a reference signal of desired frequency characteristics. In one embodiment, the reference frequency source may be a crystal oscillator. According to one embodiment, the reference frequency source may stay powered even when the radio device 106 and/or synthesizer 302 are powered Off or placed in standby mode.

The charge pump 404, a phase-to-charge converter, acts like a level-shifter or amplifier serving to boost the signal from the phase frequency detector 402. Typically, the loop filter 406 may be a low-pass filter to remove high frequency components in the phase-error signal. In one implementation, the loop filter 406 may designed as a third order type II PLL. According to one embodiment, the loop filter 406 may include sufficient capacitance to hold a voltage charge for at least several hundred micro-seconds even if the synthesizer 302 is powered Off. This capacitance may retain the voltage charge corresponding to the last operating frequency of the synthesizer 302.

The synthesizer 302 may also include logic devices to turn On and Off, or activate and deactivate, various components of the synthesizer 302.

Generally, upon powering On or restarting the synthesizer 302 it operates in open loop with the phase frequency detector 402 and main frequency divider 410 disabled. The voltage controlled oscillator 408 is enabled and operates at the frequency at which it operated before the synthesizer 302 was powered off or disabled. The voltage controlled oscillator 408 may generate its previous operating frequency by using the retained voltage charge in the loop filter 406 capacitance. The main frequency divider 410 is then enabled such that its phase initially lags the phase of the reference frequency divider 412. In one implementation, the signal phase of the main frequency divider 410 initially lags the signal phase of the reference frequency divider 412 by a known phase difference. Thus, by controlling the reference frequency divider 412 and main frequency divider 410 relative to each other the phase frequency detector 402 can be reset and enabled (closed-loop operation) into a known state such that the synthesizer 312 can lock onto a phase and frequency in a predictable deterministic way.

According to one implementation, the initial phase lag of the signal from the main frequency divider 410 is a delay of the sum of a) logic gate delay(s) and b) a maximum number of cycles of the input signal, i.e. fVCO, to the main frequency divider 410. The delay caused by the logic gate(s) and maximum number of input signal cycles may vary according the various implementations of the main frequency divider 410. In one implementation, the delay caused by the logic gates (i.e. within the main frequency divider 410) may be changed by the choice, number, and configuration of logic gate(s) employed. In another embodiment, the delay or phase lag may be fine tuned by delaying a maximum number of input frequency cycles (i.e. fVCO) before outputting a signal from the main frequency divider 410.

Figure 9:
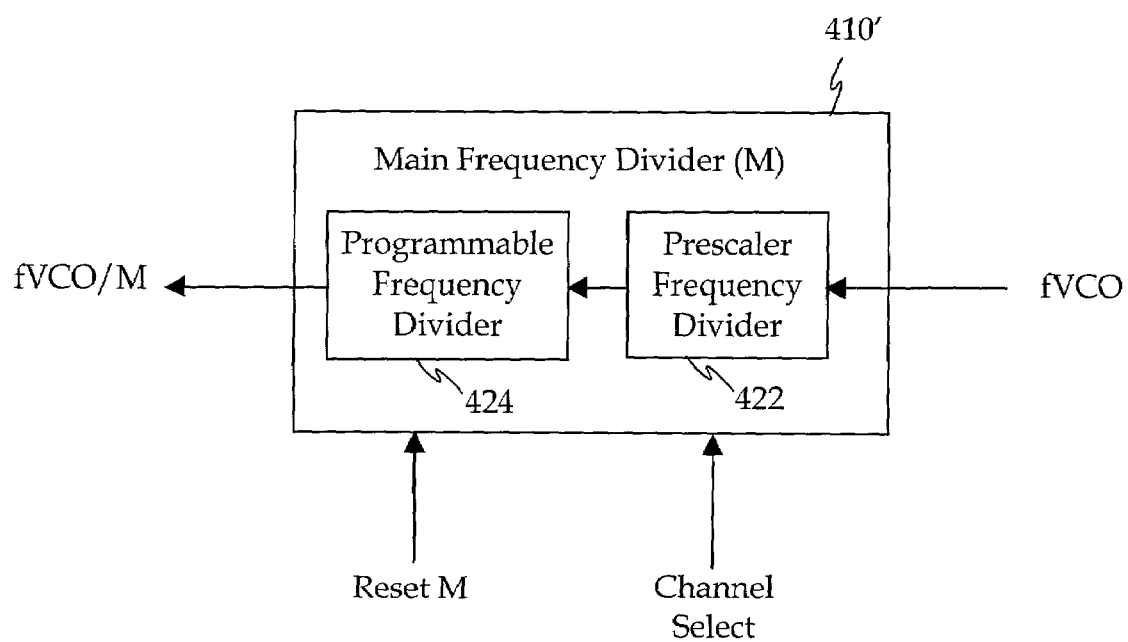
FIG. 9 is a block diagram of one embodiment of a main frequency divider as may be employed in one embodiment of the automatic fast locking power conserving synthesizer.

FIG. 9 illustrates one embodiment of a main frequency divider 410' including a multi-modulus prescaler frequency divider 422, which may be a dual modulus divider, coupled in series with a fully programmable frequency divider 424 which can be programmed to produce an output signal of desired frequency (i.e. fVCO/M). In one embodiment, the modulus (divisor value) for the prescaler frequency divider 422 may be between 16 and 128. According to one implementation, the prescaler frequency divider 422 has dual modulus 32 and 33.

The maximum number of input frequency cycles delayed by the main frequency divider 410' is determined by the modulus value of the prescaler frequency divider 422. Where the modulus value (divisor value) is 32, for example, the prescaler divider 422 causes a delay of 32 input cycles (input signal fVCO) before a first output cycle (output signal fVCO/M) is generated. Thus, upon enabling the main frequency divider 410' the initial phase lag is a known amount, including logic delays and the prescaler frequency divider delay. As illustrated in FIG. 4, the voltage controlled oscillator 408 may receive an Enable Synthesizer signal to turn On and/or Off the voltage controlled oscillator 408. A first D flip flop 414 serves to reset the main frequency divider 410 based on a Reset Synthesizer signal which is clocked by an output signal fRef/R from the output of the reference frequency divider 412. In one embodiment, the output signal fRef/R from the reference frequency divider 412 clocks the Reset Synthesizer signal to the main frequency divider 410 on a rising edge. A second D flip flop 416 serves to reset the phase frequency detector 402 based on a Reset Synthesizer signal when clocked by the output signal fVCO/M from the main frequency divider 410 thereby enabling the operation of the phase frequency detector 402. In one embodiment, the fVCO/M output signal from the main frequency divider 410 clocks the Reset Synthesizer signal to the phase frequency detector 402 on a rising edge.

The synthesizer 302 may be set to power savings mode, or standby, by turning the power Off to one or more of its components. The synthesizer 302 may be cycled, or powered Off and On intermittently, while the radio device 106 is not in use to conserve power. In FIG. 3 for instance, the voltage controlled oscillator 408 may be powered off and On via an Enable Synthesizer signal. Generally, the synthesizer 302 remains powered on while it transmits and receives transmissions. The synthesizer 302 is powered off in between transmit and receive time slots, during those receive time slots when no transmissions from another device are expected, when it is done receiving, during those transmit time slots when it has nothing to transmit, and when it is done transmitting. For example, in one embodiment, the synthesizer 302 is powered off after a listening period before the end of a receive time slot when it is determined that no transmissions are likely to occur.

The synthesizer 302 is incorporated into the radio device 106 and may be configured to conserve power. Prior to receiving or transmitting, the radio device 106 is activated or powered On. It may be activated as a result of an external signal such as the Channel Jump signal. The Channel Jump signal may be used in a channel hopping communication system to indicate that the radio device 106 should change to a new frequency or channel.

While one embodiment of the invention is shown in FIG. 4, it must be understood that the invention may be practiced in other embodiments without deviating from the invention. For example, the synthesizer 302 may be implemented as an integer-N synthesizer.

Figure 5:
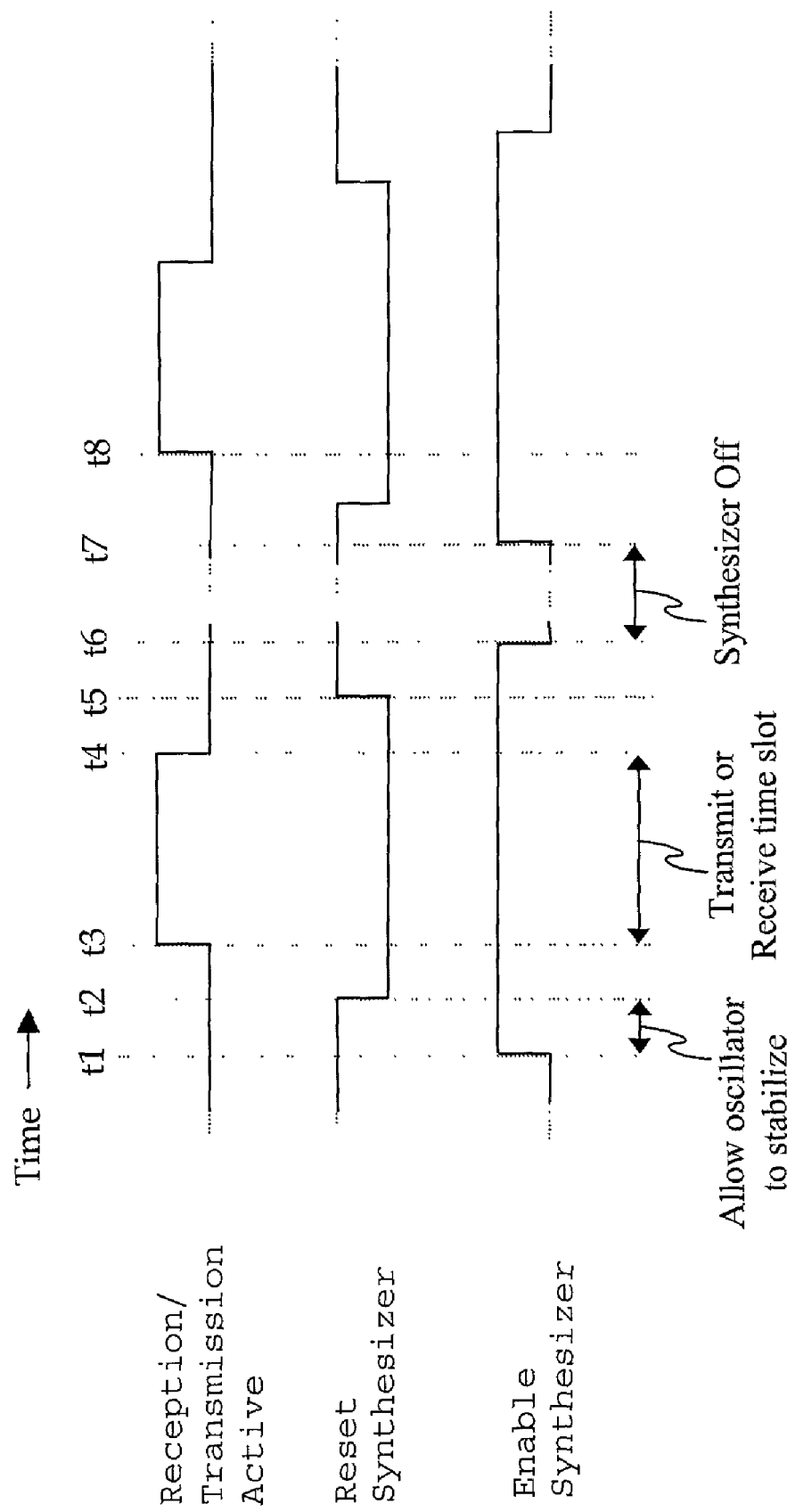
FIG. 5 is a waveform diagram illustrating the operating sequence of control signals of one embodiment of the automatic fast locking power conserving synthesizer.

FIG. 5 illustrates waveform diagrams showing the operation and timing sequence of control signals of one embodiment of the synthesizer 302. While FIG. 5 provides a general description of the operation of the control signals, a more detailed view of the timing sequence of one embodiment of the synthesizer 302 is given in FIG. 6.

The Channel Jump signal, or any other chosen external signal, may trigger radio device 106 to generate one or more internal signals to restart or reactivate the synthesizer 302. Thus, the radio device 106 and/or the synthesizer 302 may automatically cycle its power. Since the radio device 106 internally controls when and how the synthesizer 302 and/or its components are cycled, the control unit 104 which controls the radio device 106 need not be aware of the power cycling of the synthesizer 302.

The radio device 106 internally generates an Enable Synthesizer signal at time t1, after the Channel Jump signal has been detected, to activate or power On one or more of its components such as the voltage controlled oscillator 408. The voltage controlled oscillator 408 operates in open loop since at time t1 the outputs of the phase frequency detector 402 and main frequency divider 410 are disabled. In open loop, the operating frequency of the voltage controlled oscillator 408 may be its previous operating frequency before being deactivated or powered Off and may be generated by using the retained voltage charge in the loop filter 406 capacitance. Once the voltage controlled oscillator 408 has settled or stabilized, a Reset Synthesizer signal is generated by the radio device 106 at time t2 to reset one or more components of the radio device such as the phase frequency detector 402 and main frequency divider 410.

Once the radio device 106 has been properly activated it may receive and/or transmit between time t3 and time t4.

When the communication time slot ends at time t4, the radio device 106 may again change to standby mode. To change to standby mode, the Reset Synthesizer signal may be used to deactivate or disable synthesizer components such as the main frequency divider 410 and phase frequency detector 402 at time t5. The Enable Synthesizer signal at time t6 may then disable or power Off the voltage controlled oscillator 408 and/or other components of the radio device 106. Note that by shutting off the synthesizer components in this order the voltage charge corresponding to the last operating frequency may be retained or stored in the capacitance of the loop filter 406.

This cycle may be repeated again after a standby period from time t6 to time t7. During this standby period, one or more synthesizer components may be powered Off or disabled to conserve power. Time t7 corresponds to the beginning of a new cycle similar to the cycle beginning at time t1.

As noted above, it is particularly important that once the synthesizer 302 is restarted it is able to lock onto the operating or carrier frequency in a relatively short period of time.

The invention permits a synthesizer 302 to restart operations in a relatively short off-to-lock time. By restarting the different components of the synthesizer 302 in a certain sequence, the invention permits the synthesizer 302 to be cycled intermittently between On and Off and still transmit and receive transmissions.

Figure 6:
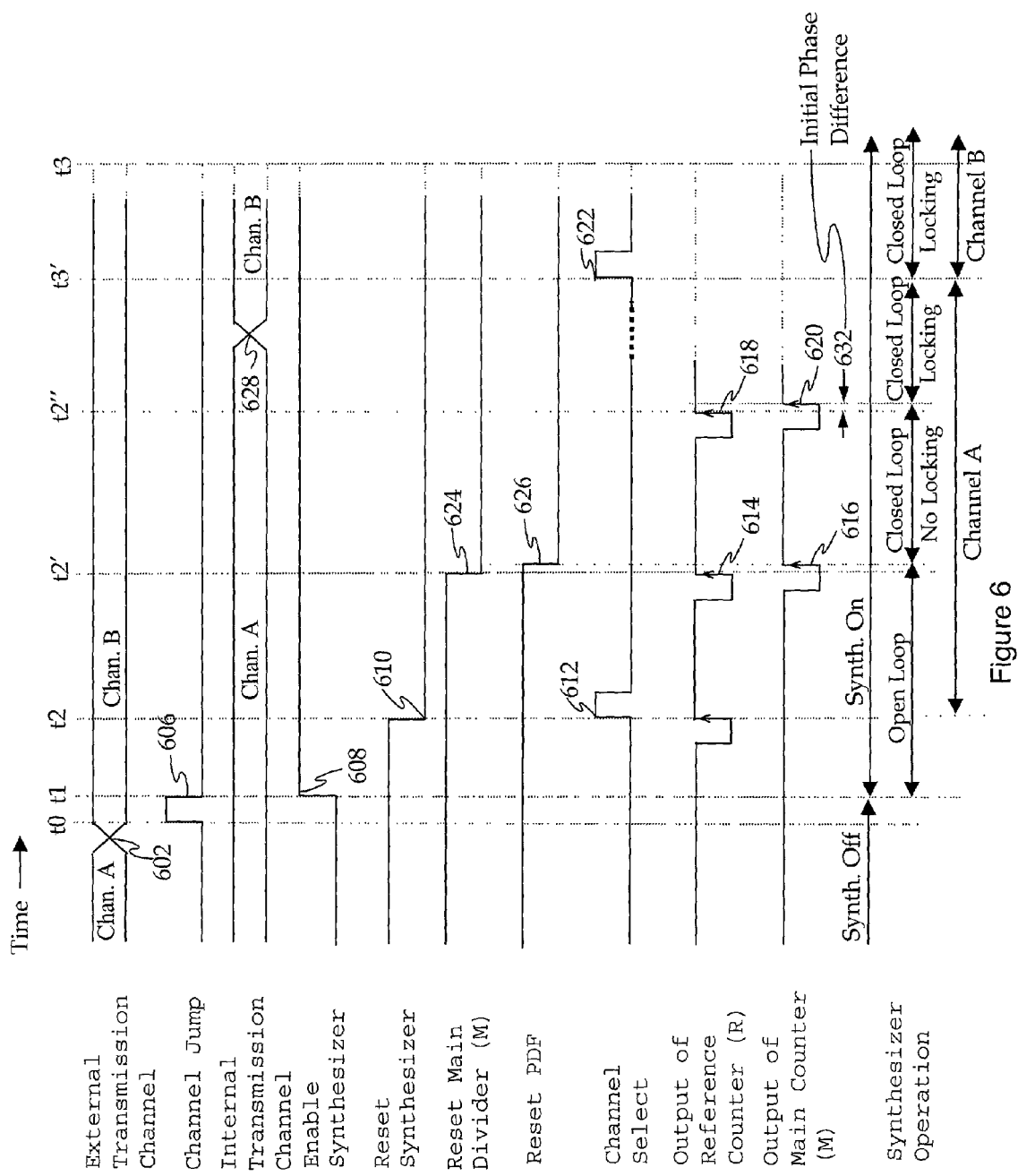
FIG. 6 is a waveform diagram illustrating the off-to-lock sequence for one embodiment of the automatic fast locking power conserving synthesizer.

FIG. 6 is a waveform diagram illustrating the off-to-lock sequence for one embodiment of the automatic fast locking power conserving synthesizer 302. This diagram represents a more detailed view of the synthesizer operation during time t1 to time t3 illustrated in FIG. 5. The timing sequences also correspond to the embodiment of the synthesizer 302 illustrated in FIG. 3 and generally described above.

Generally, the synthesizer restart or power On process illustrated in FIG. 6 first starts the synthesizer 302 at the frequency at which it operated prior to being powered off, and then changes to a new operating frequency. By starting the synthesizer 302 at the previous operating frequency, the delays associated with locking onto a frequency and phase after restarting a synthesizer are substantially reduced.

Referring to FIG. 6, at some time prior to time t0, the Transmission Channel signal indicates, directly or indirectly, the transition 602 from a first carrier frequency Channel A to a second carrier frequency Channel B. The Transmission Channel signal may be used to change the value and/or configuration of one or more components of the synthesizer such as the phase frequency detector 402, Reference Frequency Divider 412 and/or the Main Frequency Divider 410. According to one embodiment, the Transmission Channel signal serves to configure the phase frequency detector 402 and Main Frequency Divider 410. In one implementation, the Transmission Channel signal may provide a new reference frequency fRef for the synthesizer 302.

Prior to time t0, certain synthesizer components are disabled or powered Off. For instance, at time t0 the phase frequency detector 402, main frequency divider 410, and voltage controlled oscillator 408 are disabled and not providing an output signal.

At time t0, a Channel Jump signal 606, or its equivalent, is sent to the radio device 106. As noted above, the radio device 106 may use the Channel Jump signal to generate one or more internal signals to the synthesizer 302. Upon the occurrence of a Channel Jump signal 606, the radio device 106 generates an Enable Synthesizer signal 608 to enable or power On components of the synthesizer 302 that may have been powered Off. For instance, at time t1 the voltage controlled oscillator 408 is restarted by the Enable Synthesizer signal 608. A time period between time t1 and time t2 may serve to allow the voltage controlled oscillator 408 to reach stable oscillation.

After stable oscillation has been reached but before the loop is closed at time t2", the voltage controlled oscillator 402 sets its initial operating frequency from the retained voltage charge in the loop filter capacitance. The loop filter 406 may have sufficient capacitance to maintain a voltage charge for at least the time interval during which the synthesizer 302 is powered off in between time slots; time t4 to time t8 in FIG. 5 for instance. Thus, the loop filter 406 may serve as a memory to store the DC voltage corresponding to the last operating frequency prior to powering off the synthesizer 302.

At time t2, after the voltage controlled oscillator 408 is powered On and allowed to stabilize its oscillation, a Reset Synthesizer signal 610 is generated by the radio device 106. The Reset Synthesizer signal 610 serves to initialize and start the main frequency divider 410 and phase frequency detector 402. However, the start of these components 410 and 402 is delayed and synchronized by logic devices 414 and 416. Meanwhile, the outputs of the phase frequency detector 402 and main frequency divider 410 remain disabled with the synthesizer 302 operating in open loop.

Just after time t2, a Channel Select signal is generated by the radio device 106. This signal serves to initialize the phase frequency detector 402 and main frequency divider 410 to their previous operating values or settings before the synthesizer was powered Off or disabled. While the phase frequency detector 402 and main frequency divider 410 are initialized, their output remains disabled.

At time t2', the first D flip flop 414 clocks in the Reset Synthesizer signal 610 upon the first rising edge of the output signal 614 from the reference frequency divider 412 thereby resetting Reset M 624 and enabling the operation and output of the main frequency divider 410. A short time later, the second D flip flop 416 clocks-in the Reset Synthesizer signal 610 to Reset PFD 626 and enable the operation and output of the phase frequency detector 402. After enabling the phase frequency detector 402, the synthesizer 302 operates in closed loop although no Phase-Error signal is generated until the phase frequency detector 402 receives signals from the reference frequency divider 412 and the main frequency divider 410.

By disabling the phase frequency detector 402 while its input signals are setup, this reduces the amount of time it would take to lock onto the phase of the carrier or operating frequency. That is, the sequence in which the input signals fRef/R and fVCO/M arrive to the phase frequency detector 402 is controlled to provide predictable performance upon starting the phase frequency detector 402.

Starting at time t2", the phase frequency detector 402 detects the signal from the reference frequency divider 618; then a short time later 620 the phase frequency detector 402 detects the signal from the main frequency divider 410. The phase frequency detector 402 may then compare the phase difference/error between the reference frequency divider signal and the main frequency divider signal and generate a phase-error signal to the voltage controlled oscillator 408 calculated to lock its two inputs into phase. Because the reference frequency signal fRef/R reaches the phase frequency detector first 618, followed by the feedback signal fVCO/M 620, the phase frequency detector 402 is able to take the shortest route to bringing the signals into phase. This known systematic initial phase error 632, from times 618 to 620, allows the synthesizer 302 to phase lock in a predictable fashion.

By coarsely locking onto the previous operating frequency, the synthesizer 302 is able to bring its two input signals into phase much quicker than it otherwise would. This reduces the time it takes to change and lock onto a new frequency.

The synthesizer 302 may then generate a second Channel Select signal 622 at time t3' to change from the previous operating frequency to a new operating frequency. This second Channel Select signal 622 may occur after the reference frequency divider 412 signal and the main frequency divider 410 signal are coarsely or substantially, but not necessarily completely, locked in phase. This reduces the time it takes to jump to the next channel.

Changing to the next transmission channel at time t3' may be accomplished by reconfiguring one or more components such as the phase frequency detector 402 and/or the main frequency divider 410.

According to one embodiment, the reference frequency fRef is generated by a source which is continually powered on even when the radio device 106 is disabled or turned Off. By keeping the reference frequency source powered On, this reduces the restart time of the synthesizer 302 since it avoids the settling time delays of the reference frequency source.

Generally, this start sequence takes less time than it would otherwise take to start the synthesizer 302 without controlling the order in which the synthesizer components are restarted. In one implementation, the time it takes to start the synthesizer 302 and lock into the new channel or carrier frequency is less than or equal to two hundred microseconds (200 μsec.). In the embodiment illustrated in FIG. 6, this may be the time period between time t1 when the Channel Jump signal is received and time t3 when the synthesizer 302 is ready to transmit or receive.

Figure 7:
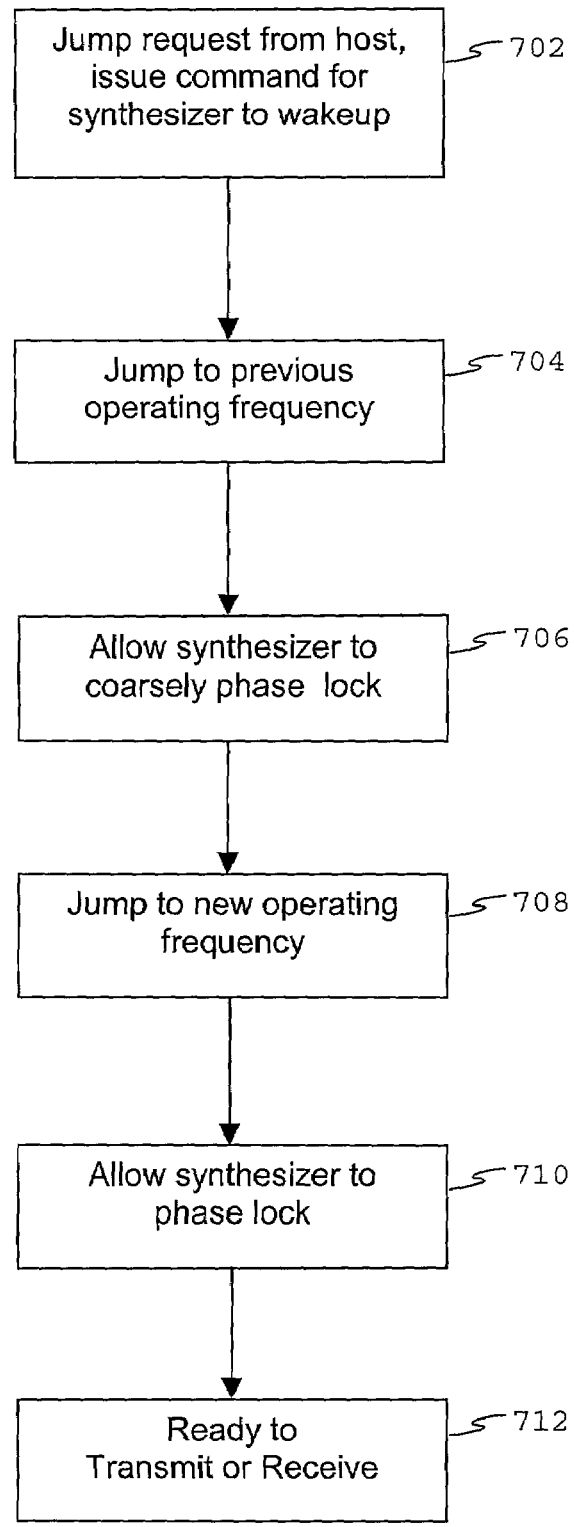
FIG. 7 is a flowchart of steps in a control sequence for one method of one embodiment of the automatic fast locking power conserving synthesizer.

FIG. 7 is a flowchart of a control sequence for the steps of one method of one embodiment of the automatic fast locking power conserving synthesizer 302. Once the synthesizer 302 is disabled, in standby mode, or in power saving mode, the restart process may be triggered by a jump channel request at step 702 by an external device, such as a baseband controller. This enables one or more components of the synthesizer 302 to jump to the operating frequency of the synthesizer 302 before it was turned Off or placed in standby or sleep mode at step 704. Then at step 706, the synthesizer 302 is allowed to coarsely lock the phase of its output to a reference signal. Once a coarse lock has been achieved, a jump to the desired operating frequency occurs at step 708. After a settling time, the synthesizer 302 locks to a desired operating frequency at step 710. Then the synthesizer 302 is ready to receive or transmit on the new operating frequency at step 712.

According to one implementation of this invention, the synthesizer method and/or apparatus need not first coarsely lock to the previous operating frequency. Rather, the invention may be practiced by starting the synthesizer at a desired operating frequency. Such would be the case when the synthesizer is first powered On after a long time for instance.

Figure 8:
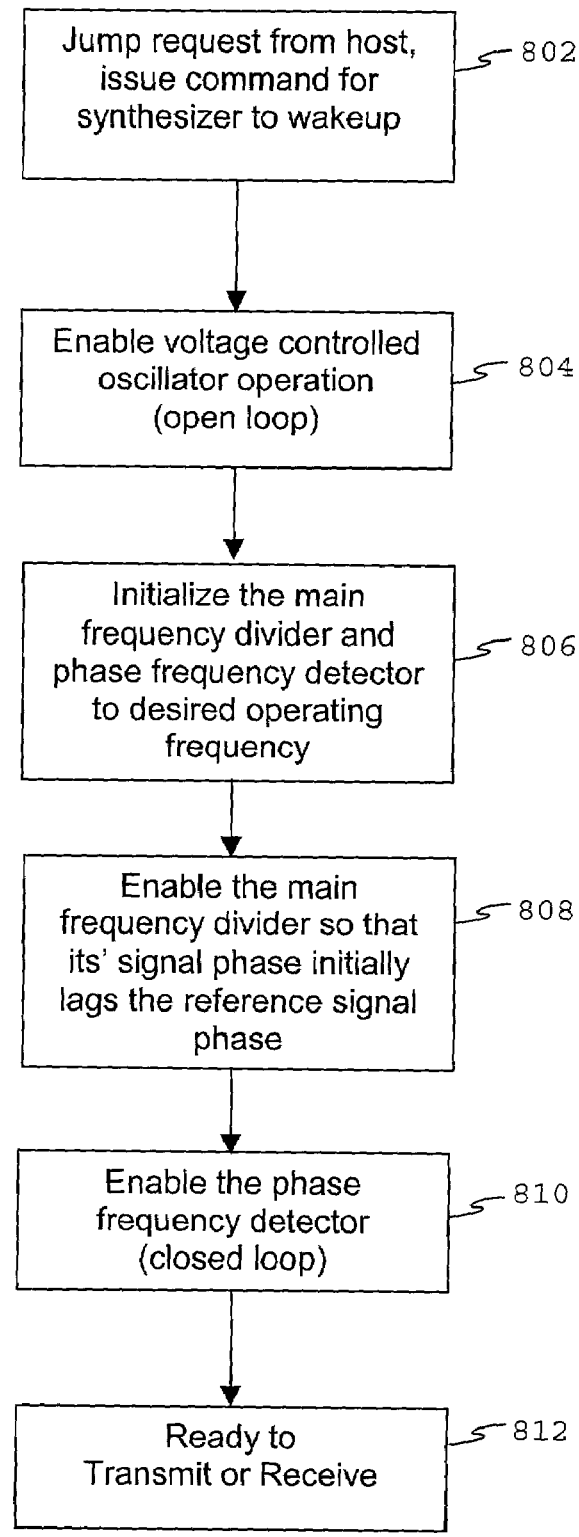
FIG. 8 is a flowchart of steps in a control sequence for another method of one embodiment of the automatic fast locking power conserving synthesizer.

FIG. 8 illustrates a method of how the invention may be practice without first locking to the previous operating frequency. Note that this method applies equally to an apparatus such as that shown in FIG. 4. A jump request is interpreted as a command for the synthesizer to wakeup 802. As before, the voltage controlled oscillator is enabled for operation 804. Since the main frequency divider 410 and phase frequency detector 402 remain disabled, the synthesizer 302 operates in open loop. The main frequency divider 410 and phase frequency detector 402 are initialized to operate at the desired frequency 806. However, they remain disabled and not providing an output signal. As before, the main frequency divider 410 is enabled so that the phase of its output signal lags the phase of the reference frequency divider 412 signal 808. According to one implementation, the main frequency divider 410 output signal lags initially the reference frequency divider 412 output signal by a known amount, i.e. 632 in FIG. 6. The phase frequency detector is then enabled 810 so that the synthesizer operates in closed loop. The synthesizer is then ready to transmit or receive at the desired operating frequency.

This starting sequence generally allows the synthesizer to lock onto a phase quicker than it otherwise would. For example, if the phase frequency detector 402 had been started with the phase of the signal from the main frequency divider 410 leading the phase of the signal from the reference frequency divider 412 by one degree, it would have taken three hundred and fifty-nine degrees to phase lock. By guaranteeing that the phase from the main frequency divider 410 initially slightly lags the phase of signal from the reference frequency divider 412, the time to phase lock can be substantially reduced. In various embodiments, the initial phase difference between the signals from the main frequency divider 410 and reference frequency divider 412 may be an unknown amount, an unknown amount within a range, or a known amount.

The synthesizer 302 may be embodied in one or more integrated circuit devices. Parts of the synthesizer restarting scheme describe above may be implemented by software. This process and apparatus may also serve as a means to conserve power.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, the invention has been described herein with reference to a channel hopping communication system. Other kinds of communication systems may be used. Additionally, the invention has been described for restarting the synthesizer on a channel jump signal but it is equally applicable to restarting the synthesizer on many other signals. Additionally, it is possible to implement the invention or some of its features in hardware, firmware, software or a combination thereof where the software is provided in a processor readable storage medium such as a magnetic, optical, or semiconductor storage medium.

What is claimed is:

1. A method for activating a deactivated frequency synthesizer comprising:
    activating a voltage controlled oscillator;
    allowing the voltage controlled oscillator to stabilize;
    configuring a main frequency divider of the synthesizer to operate as it had prior to deactivation of the synthesizer; and
    activating the main frequency divider.

2. The method of claim 1 further comprising:
    deactivating a phase frequency detector prior to activating the main frequency divider; and
    activating the phase frequency detector after the main frequency divider is activated.

3. The method of claim 2 further comprising:
    activating a reference frequency divider.

4. The method of claim 3 wherein the main frequency divider is activated so that a signal from the reference frequency divider initially reaches the phase frequency detector before a signal from the main frequency divider.

5. The method of claim 3 wherein the main frequency divider is activated such that the phase of a signal from the main frequency divider initially lags a phase of a signal from the reference frequency divider at the phase frequency detector.

6. The method of claim 1 further comprising:
    configuring a reference frequency divider of the synthesizer to operate as it had prior to deactivation of the synthesizer.

7. The method of claim 1 further comprising:
    tuning the voltage controlled oscillator to the frequency the synthesizer had operated at before being deactivated.

8. The method of claim 7 wherein tuning the voltage controlled oscillator includes
    receiving an initial voltage signal stored in a capacitive device corresponding to the operating frequency the synthesizer had operated at before being deactivated.

9. The method of claim 1 further comprising:
    tuning the voltage controlled oscillator to the new desired operating frequency.

10. The method of claim 9 wherein the time in between activating the voltage controlled oscillator and tuning the voltage controlled oscillator to the new desired operating frequency is less than or equal to two hundred microseconds.

11. A method for activating a synthesizer comprising:
    activating a synthesizer voltage controlled oscillator;
    activating a main frequency divider such that it is initially out of phase with a reference frequency divider; and
    activating a phase frequency detector after the main frequency divider is activated to receive input signals from the reference frequency divider and the main frequency divider.

12. The method of claim 11 for activating a synthesizer wherein the main frequency divider is activated such that its output signal initially lags a phase of an output signal from the reference frequency divider by a known phase difference.

13. The method of claim 11 for activating a synthesizer wherein the phase frequency detector provides a phase-error signal corresponding to the difference between the phases of output signals from the main frequency divider and reference frequency divider.

14. The method of claim 13 for activating a synthesizer wherein the phase-error signal from the phase frequency detector causes the main frequency divider to shift the phase of its output signal to the phase frequency detector.

15. The method of claim 14 for activating a synthesize wherein the main frequency divider shifts the phase of its output signal by advancing the phase of its output signal.

16. A frequency synthesizer comprising:
    a phase frequency detector to detect the phase difference between a first input signal and a second input signal and output a corresponding phase-error signal;
    a first reference frequency source coupled to the phase frequency detector and to provide a first frequency signal as the first input signal to the phase frequency detector;
    a voltage controlled oscillator, coupled to the phase frequency detector to receive the phase-error signal from the phase frequency detector and generate an output signal at a corresponding frequency and phase; and
    control logic to activate the synthesizer when a transmission is expected configured to activate the voltage controlled oscillator, allow the voltage controlled oscillator to stabilize, inhibit the phase frequency detector, enable the first input signal to the phase frequency detector, enable the second input signal to the phase frequency detector, and activate the phase frequency detector.

17. The synthesizer of claim 16 wherein the phase frequency detector generates the output phase-error signal as a result of phase differences between the first input signal and the second input signal to bring the first input signal and second input signal into phase.

18. The synthesizer of claim 16 further comprising:
    a frequency filter to filter the signal from the phase frequency detector and to maintain a charge corresponding to the DC value of the phase-error signal from the phase frequency detector when the synthesizer is deactivated.

19. The synthesizer of claim 18 wherein the frequency filter includes a capacitive element which stores a voltage charge corresponding to the phase-error signal from the phase frequency detector while the synthesizer is deactivated.

20. The synthesizer of claim 16 further comprising:
a reference frequency divider coupled to the first reference frequency source to provide the first input signal to the phase frequency detector; and
a main frequency divider coupled to the output of the voltage controlled oscillator and adapted to provide the second input signal to the phase frequency detector.

21. The synthesizer of claim 20 wherein the reference frequency divider and main frequency divider are counter devices.

22. The synthesizer of claim 20 wherein the reference frequency divider is configured to provide a desired operating frequency.

23. The synthesizer of claim 20 wherein the main frequency divider is configured to provide a desired operating frequency.

24. The synthesizer of claim 16 wherein the control logic is configured to first activate the synthesizer to a frequency the synthesizer had previously operated at before being deactivated.

25. The synthesizer of claim 24 wherein the synthesizer is allowed to coarsely tune to its previous operating frequency.

26. The synthesizer of claim 25 wherein once the synthesizer is coarsely tuned to its previous operating frequency, the control logic is configured to change the synthesizer frequency to a new desired operating frequency.

27. The synthesizer of claim 16 wherein just after the phase frequency detector is activated the control logic is configured to cause the first input signal to reach the phase frequency detector before the second input signal.

28. The synthesizer of claim 16 wherein the phase of the second input signal initially lags the phase of the first input signal by a known phase difference.

29. An apparatus comprising:
means for activating a synthesizer device;
means for setting an operating frequency of the synthesizer device to a frequency the synthesizer device had operated at before being deactivated; and
mean for setting the operating frequency of the synthesizer device to a new desired operating frequency.

30. The apparatus of claim 29 further comprising:
means for activating a voltage controlled oscillator;
means for allowing the voltage controlled oscillator to stabilize;
means for tuning the voltage, controlled oscillator to the frequency the synthesizer device had operated at before being deactivated; and
means for tuning the voltage controlled oscillator to the new desired operating frequency.

31. The apparatus of claim 29 further comprising:
means for configuring a main frequency divider of the synthesizer device to values it operated at prior to having deactivated the synthesizer device; and
means for activating the main frequency divider.

32. The apparatus of claim 31 further comprising:
means for deactivating a phase frequency detector prior to activating the main frequency divider; and
means for activating the phase frequency detector after a reference frequency divider.

33. The apparatus of claim 31 further comprising:
means for activating a reference frequency divider.

34. The apparatus of claim 33 wherein the reference frequency divider is activated before the main frequency divider.

35. An apparatus comprising:
means for deactivating a phase frequency detector;
means for providing a first signal to the phase frequency detector;
means for providing a second signal to the phase frequency detector such that a phase of the second signal initially lags a phase of the first signal; and
means for activating the phase frequency detector.

36. The apparatus of claim 35 further comprising:
means for providing a carrier frequency at a desired frequency.

37. The apparatus of claim 35 further comprising:
means for configuring the means for providing a first signal to provide a signal corresponding to a desired frequency.

38. The apparatus of claim 35 further comprising:
means for configuring the means for providing a second signal to provide a signal corresponding to a desired frequency.

39. A method for conserving power comprising:
deactivating a synthesizer while not in use;
activating the synthesizer, including
configuring a main frequency divider to operate a first desired frequency;
providing a reference signal to a phase frequency detector; and
activating the main frequency divider to provide an output signal to the phase frequency detector, a phase of the output signal lagging a phase of the reference signal to the phase frequency detector.

40. The method of claim 39 for conserving power wherein the phase frequency detector provides a phase-error signal corresponding to the difference between the phase of the reference signal and the phase of the output signal from the main frequency divider.

41. The method of claim 40 for conserving power further comprising:
providing the phase-error signal to a voltage controlled oscillator such that the voltage controlled oscillator provides an operating frequency signal for the synthesizer at the desired frequency.

42. The method of claim 41 for conserving power wherein deactivating the synthesizer when not in use includes
deactivating the voltage controlled oscillator when the synthesizer is not in use.

43. The method of claim 42 for conserving power wherein the synthesizer is not in use when it is not receiving or transmitting.

44. The method of claim 39 for conserving power wherein deactivating the synthesizer when not in use includes
deactivating the phase frequency detector when the synthesizer is not in use.

45. The method of claim 39 for conserving power wherein deactivating the synthesizer when not in use includes
deactivating the main frequency divider when the synthesizer is not in use.

46. The method of claim 39 for conserving power wherein activating the synthesizer includes
activating a voltage controlled oscillator;
configuring a main frequency divider to operate at a frequency it operated at before being deactivated;
providing a reference signal to a phase frequency detector;
activating the main frequency divider to provide an output signal to a phase frequency detector, a phase of the output signal lagging a phase of the reference signal to the phase frequency detector;

permitting the voltage controlled oscillator to coarsely lock onto the frequency it operated at before being deactivated; and configuring the main frequency divider to operate at the first desired frequency.

47. The method of claim 39 for conserving power wherein activating the synthesizer includes configuring a reference frequency divider to provide the reference signal to the phase frequency detector corresponding to the desired operating frequency.

* * * * *